United States Patent [19]

Willis

[11] 4,163,926
[45] Aug. 7, 1979

[54] SWITCHING REGULATOR FOR A TELEVISION APPARATUS

[75] Inventor: Donald H. Willis, Indianapolis, Ind.

[73] Assignee: RCA Corporation, New York, N.Y.

[21] Appl. No.: 940,286

[22] Filed: Sep. 7, 1978

[51] Int. Cl.² .................... H01J 29/70; H01J 29/76
[52] U.S. Cl. .................................. 315/408; 358/190
[58] Field of Search ............... 315/408, 399; 358/190

[56] References Cited

U.S. PATENT DOCUMENTS

| 3,916,288 | 10/1975 | Hicks et al | 358/190 |
| 4,079,418 | 3/1978 | Kupka et al. | 358/190 |

FOREIGN PATENT DOCUMENTS 2346061 3/1975 Fed. Rep. of Germany ........... 315/408

Primary Examiner—Theodore M. Blum
Attorney, Agent, or Firm—Eugene M. Whitacre; Paul J. Rasmussen; William H. Meise

[57] ABSTRACT

A controllable switch is coupled to a source of unregulated direct voltage and in a closed loop with a filter inductor and a storage capacitor and has its on-off state controlled at the horizontal deflection rate to control the voltage across the capacitor and regulate a voltage. A diode is coupled with the filter inductor and storage capacitor to form a second series circuit through which current can continue to flow in the inductor when the controllable switch is opened. The controllable switch is opened abruptly by application of a reverse biasing flyback pulse to its main current conducting path. The flow of current in the filter inductor is smoothed and may extend over the entire horizontal cycle.

8 Claims, 6 Drawing Figures

SWITCHING REGULATOR FOR A TELEVISION APPARATUS

BACKGROUND OF THE INVENTION

This invention relates to a switching regulator having improved characteristics for a television display arrangement.

In order to avoid the weight and cost of a line isolation transformer, television receivers may be supplied with power directly from the ac power line through a rectifier and filter. The filtered direct voltage will vary in proportion to the variations in the ac power line voltage, which may be undesirable. Also, the value of the filtered direct voltage will be approximately the peak value of the alternating-current input, and may be greater or less than the desired value.

It is possible to produce a regulated output voltage of lesser magnitude than the raw dc input by use of a series-pass regulator circuit, but this has the disadvantage of substantial power dissipation when the load current and/or the difference between the raw voltage and the regulated voltage are large.

Recently, an emphasis on reduced power consumption has lead to the increased use of switching regulators for powering television receivers. In switching regulators, a switch coupled to the raw direct-voltage supply is periodically turned on and off with a duty cycle adapted for regulation of the controlled voltage. U.S. Pat. No. 4,024,434 issued May 17, 1977 in the name of Joosten et al. illustrates the use of a transistor operated as a switch for reduced dissipation. While the power dissipation is reduced by this form of operation, transistors often have low gain and require considerable base drive in order to operate in the low-power saturated mode. Further, the inductor often associated with the switching regulator requires a so-called free-wheeling diode to prevent application of excessive voltages to the transistor at turn-off and to recover energy stored in the inductor.

By the use of controlled rectifiers such as SCRs the base drive problem associated with the use of transistor switches is obviated. The SCR is regenerative, and when gated into conduction remains conductive so long as forward bias is maintained across the main conduction path. Thus, a gate pulse may be momentarily applied to the SCR control electrode to initiate conduction and then need no longer be supplied to maintain conduction. The controlled-rectifier switch is turned off when forward current diminishes to zero and attempts to reverse, normally caused by application of a reverse voltage from an external source. The SCR is advantageous by comparison with the transistor not only because of its gating characteristics but also because application of reverse voltages exceeding the reverse voltage breakdown of the device does not result in its destruction but merely switches it into the conductive mode.

U.S. Pat. No. 3,970,780 issued July 20, 1976 in the name of Minoura describes a switching regulator in which an SCR is used as the control element for controllably charging a capacitor from the unregulated supply through the series connection of an inductor and a winding coupled to the horizontal deflection circuit. In the Minoura arrangement, the inductor must be small enough so that the current in the inductor and SCR can be reduced to zero during the retrace interval by the difference between the unregulated direct voltage and the turn-off voltage pulse across the winding. As a result, relatively large peak currents flow in the inductor and in the storage capacitor during the capacitor charging interval. These relatively large currents undesirably result in relatively large $I^2R$ or heating losses. Also, the turn-off requirements and the relatively large changes in regulator current with changes in load current such as those resulting from kinescope beam current changes produces large changes in regulator peak currents. These changes in peak current passing through the regulator SCR and turn-off windings result in changes in the amount of energy coupled between the winding and the horizontal output transistor of the deflection circuit, and contribute to retrace time modulation and storage time modulation in the base of the output transistor as a function of beam current. The storage time modulation causes bending of vertical lines displayed on the raster. It is desirable to reduce the retrace time modulation and bends resulting from beam current changes, to reduce peak currents and heating losses and to reduce the load-dependent variation in the voltage pulse available to the turn-off regulator SCR in order that a larger filter inductor may be used.

SUMMARY OF THE INVENTION

A switching regulator includes a controllable switch of the type including a gate and a main current conducting path which when forward biased remains open or nonconductive until a signal is applied to the gate and which thereafter remains closed or conductive so long as the forward bias is maintained. The main current path is coupled in series with a filter inductor and a horizontal deflection generator, and the series combination is coupled across a source of unregulated direct voltage for providing a path for an increasing current flow in the inductor during those intervals in which the switch is closed. Horizontal rate signals are coupled from the deflection generator to the main current conducting path for controlling the opening of the switch. A diode is coupled to the inductor to form a path for a decreasing current flow in the inductor during at least a portion of the intervals in which the switch is open. A capacitor is coupled to the deflection generator for filtering the current flow in the inductor to form an energizing voltage for the deflection generator. A control circuit is coupled to the deflection generator and to the gate for sensing the voltage to be regulated and for controlling the average of the increasing and decreasing currents in the inductor to control the energizing voltage in a feedback manner.

DESCRIPTION OF THE INVENTION

Figure 1:
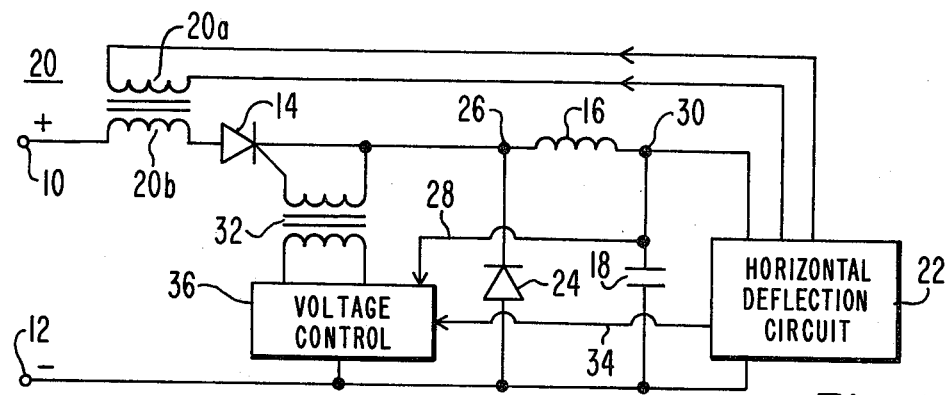
FIGS. 1–4 are diagrams in block and schematic form of portions of a television display apparatus embodying the invention.

In FIG. 1, terminals 10 and 12 are adapted to be coupled to a source of unregulated direct voltage such as rectified and filtered power-line voltage. The anode-cathode path of an SCR 14, a filter inductor 16 and a horizontal deflection circuit 22 are coupled together at circuit points 26 and 30 in the order mentioned to form a first series circuit. The series circuit is coupled across supply terminals 10 and 12 by a secondary winding 20b of a transformer 20. A storage capacitor 18 is coupled between circuit point 30 and supply terminal 12. Deflection circuit 22 is energized by the voltage appearing across the capacitor. A diode 24 has its anode connected to terminal 12, hereinafter referred to as "ground," and its cathode connected at a junction point 26 to a terminal of inductor 16 to form a closed second series path or circuit for the flow of current through inductor 16, capacitor 18 and diode 24.

A voltage control circuit illustrated as a block 36 is coupled to ground and by a conductor 28 to junction point 30. Voltage control circuit 36 may be of the type well-known in the art and exemplified in the aforementioned Minoura patent. Voltage control circuit 36 senses the voltage between point 30 and ground and produces periodic gating pulses which are coupled by means of a transformer 32 to the gate of SCR 14 to maintain the voltage at point 30 substantially constant relative to ground. A conductor 34 couples horizontal deflection circuit 22 with voltage control circuit 36 for synchronization of the periodic gating pulses with the horizontal deflection in known manner. The primary winding 20a of transformer 20 is coupled to horizontal deflection circuit 22 for coupling retrace voltage pulses from the horizontal deflection circuit to the main anode-cathode current conducting path of SCR 14 by way of a turn-off secondary winding 20b for periodically opening or rendering SCR 14 nonconductive.

Figure 5:
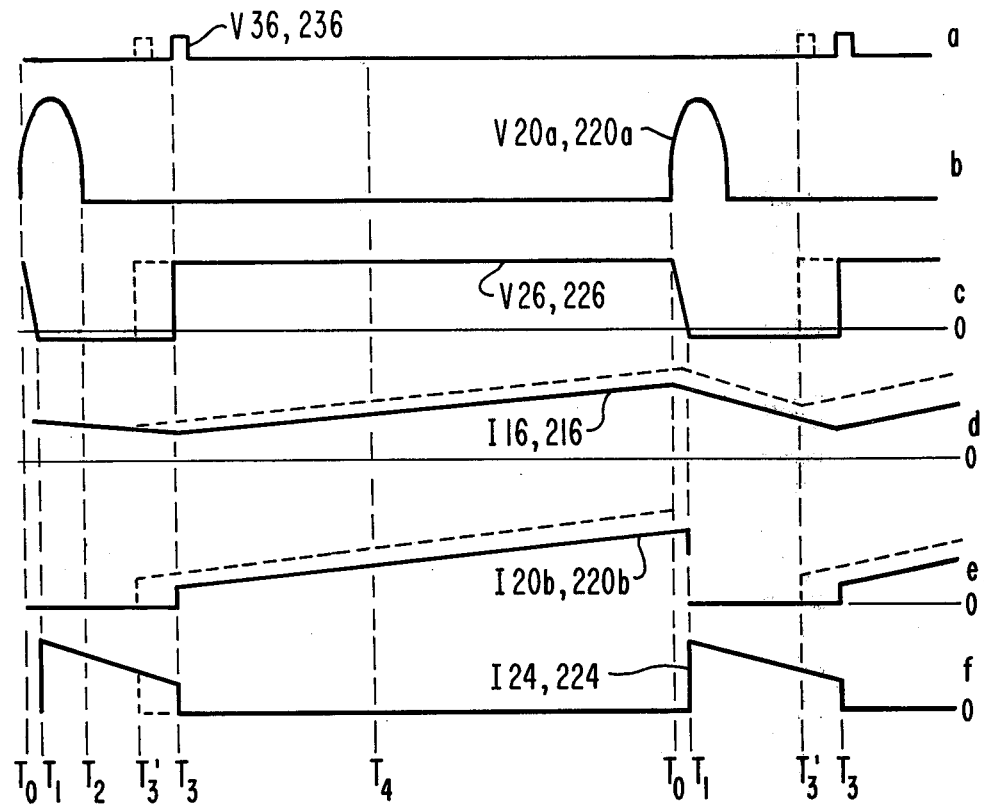
FIGS. 5 and 6 illustrate as amplitude-time waveforms certain periodic voltages and currents occurring in the apparatuses of FIGS. 1–4 during operation.

In operation, voltage control circuit 36 produces SCR gating pulses illustrated as V36 of FIG. 5a, which are produced in timed relation with the retrace voltage pulses illustrated as V20a of FIG. 5b produced across primary winding 20a by horizontal deflection circuit 22. Immediately before time T0 as illustrated in FIG. 5, the voltage produced by winding 20b is small and SCR 14 is conductive, thereby making the voltage between circuit point 26 and terminal 12 positive as illustrated by V26 of FIG. 5c and reverse-biasing diode 24. With SCR 14 conductive, the unregulated voltage is applied across the series combination of winding 20b, inductor 16, and horizontal deflection circuit 22, producing an increasing current in inductor 16 and in winding 20b as illustrated by I16 of FIG. 5d and I20b of FIG. 5e. The current charges capacitor 18 and also supplies the requirements of horizontal deflection circuit 22. The charging of capacitor 18 causes the voltage at point 30 to increase slightly.

At time T0, deflection circuit 22 initiates a retrace pulse. As the retrace voltage rises, the voltage at the anode of SCR 14 becomes progressively more negative. The energy associated with the magnetic field of inductor 16 causes current to continue to flow through SCR 14 until a time T1 at which the anode of SCR 14 is at substantially ground potential and circuit point 26 is negative with respect to ground by the forward conduction drop of the SCR. At this time, diode 24 takes over conduction from SCR 14. Further increase in the retrace voltage pulse magnitude reverse-biases SCR 14 and renders it nonconductive.

In the interval after time T1, SCR 14 is nonconductive and a portion of the energy associated with the magnetic field of inductor 16 is transferred to capacitor 18 by a decreasing circulating current through the second series path including inductor 16, capacitor 18 and diode 24 as illustrated by I24 of FIG. 5f. At a later time T2 the retrace interval ends, and SCR 14 once again becomes forward biased. However, SCR 14 does not conduct until a later time T3 at which a gating pulse is applied to the gate of the SCR to render it conductive. At time T3, the voltage at point 26 increases to substantially equal the sum of the unregulated direct voltage and the voltage across winding 20b. Diode 24 becomes back biased and therefore nonconductive, and inductor current I16 once again begins to increase, continuing transfer of charge to capacitor 18 and deflection circuit 22 as energy is once again stored in inductor 16.

As described, the current in inductor 16 decreases from a time near the beginning of the retrace interval until time T3 at which SCR 14 is gated into conduction. At time T3, the current in inductor 16 stops decreasing and begins to increase. The current is filtered by capacitor 18 to form an energizing voltage for deflection circuit 22. The energizing voltage is regulated by control of time T3. Thus, if the regulated voltage at terminal 30 relative to ground tends to decrease below the desired value, control circuit 36 produces a gating pulse V36 earlier during the deflection cycle, as illustrated by time T3' in FIG. 5. As shown by the dashed lines in FIGS. 5c–5d, earlier gating results in a net increase in the average of current I16 through winding 16. Such a net increase can maintain the reguated voltage at point 30 in the presence of an increased current drain by deflection circuit 22, or can compensate a tendency to a low regulated voltage produced by a low value of unregulated voltage or by other causes.

As described, the operation of the arrangement of FIG. 1 applies when inductor 16 is relatively large. For smaller values of inductance of inductor 16, the current in the winding may be reduced to zero before time T3 at which the SCR is gated ON, in which case voltage V26 at circuit point 26 will rise to equal the regulated voltage when current flow ceases in inductor 16 and diode 24.

Figure 2:
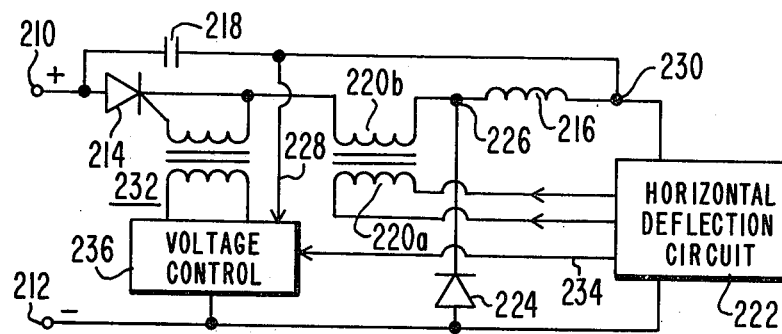

While the foregoing explanation describes capacitor 18 as being coupled between the regulated voltage terminal 30 and ground, capacitor 18 may be connected between circuit point 30 and other reference voltage points. FIG. 2 illustrates an arrangement similar to that of FIG. 1 in which a different reference point for storage capacitor 18 is used, and also illustrates the interchange of the series connection of winding 20b and SCR 14. In FIG. 2, elements corresponding to those of FIG. 1 are given the same reference numerals, in the 200 series. In FIG. 2, terminals 210 and 212 are adapted to be coupled to a source of unregulated direct voltage. A controllable switch in the form of an SCR 214 has its main current conducting path serially coupled at circuit points 226 and 230 with a filter inductor 216 and a horizontal deflection circuit 222, and the series combination is coupled across the terminals of the unregulated source. A storage capacitor 218 is coupled between circuit point 230 and terminal 210. A diode 224 has its anode coupled to terminal 212 of the source and its cathode connected to inductor 216 at circuit point 226 to form a series circuit with inductor 216 and capacitor 218 in which current can flow in a closed path including terminals 210, 212 and the unregulated voltage source. A voltage control circuit 236 is coupled to terminal 212 and to terminal 230 for sensing the voltage across horizontal deflection circuit 222 and is also coupled by means of a transformer 232 to the gate of SCR 214 for controlling the switching of the SCR to maintain the voltage across the deflection circuit substantially constant. Voltage control circuit 236 is also coupled to deflection circuit 222 by a conductor 234 for synchronizing the switching of SCR 214 with the deflection cycle. A turn-off winding 220b of a transformer 220 is coupled between circuit point 226 and the cathode of SCR 214. Winding 220a of transformer 220 is coupled to horizontal deflection circuit 222. Transformer 220 couples retrace pulses produced by horizontal deflection circuit 222 to SCR 214 for periodically opening the SCR. For purposes of explanation, terminal 212 is hereinafter referred to as "ground."

The operation of the arrangement of FIG. 2 differs from that of FIG. 1 in that the flow of current in the load represented by horizontal deflection circuit 222 causes a current flow in capacitor 218 which tends to cause the capacitor to charge, i.e., tends to cause the voltage across the plates of the capacitor to increase. Since the unregulated direct voltage changes relatively slowly compared with the deflection frequency, from line to line the voltage between terminals 210 and ground may be taken as being constant. As capacitor 218 charges, therefore, the voltage at circuit point 230 decreases relative to ground. Thus, just as in FIG. 1, the flow of load current tends to cause a decrease in the load voltage.

In order to raise the voltage across the horizontal deflection circuit in the arrangement of FIG. 2, capacitor 218 must be discharged. This is accomplished when SCR 214 is conductive through the closed circuit path extending from capacitor 218 to SCR 214, winding 220b and inductor 216 back to the capacitor. During the interval in which SCR 214 is conductive, current is also supplied through SCR 214 and inductor 216 to deflection circuit 222. When SCR 214 is rendered nonconductive by the retrace pulse applied by winding 220b, the energy stored in the magnetic field associated with inductor 216 is used to continue the supply of current to deflection circuit 222 and the discharge of capacitor 218 through the second closed circuit path extending from inductor 216 to circuit point 230, capacitor 218, the unregulated voltage source and through diode 224 back to inductor 216. In so doing, a portion of the stored energy is returned to the unregulated voltage source.

The detailed operation of the arrangement of FIG. 2 can be explained with the aid of FIG. 5. Immediately prior to time T0 at which retrace voltage pulses are produced by deflection circuit 222, SCR 214 is conductive and the voltage at circuit point 226 substantially equals the sum of the unregulated voltage and the voltage across winding 220b, as illustrated by V226 of FIG. 5c. The current in inductor 216 is increasing as illustrated by I216 of FIG. 5d under the impetus of the voltage across capacitor 218. The current in inductor 216 also flows through winding 220b at this time, as illustrated in FIG. 5e. At a time T0, a retrace pulse V220a is applied to the primary of transformer 220, and a pulse voltage is applied between circuit point 226 and the cathode of SCR 214 poled to make circuit point 226 negative and the cathode of SCR 214 positive. So long as SCR 214 is conductive, its cathode is at substantially the unregulated direct voltage, and therefore circuit point 226 is driven progressively more negative as the retrace voltage increases. At a time T1 at which the voltage pulse appearing across winding 220b substantially equals the unregulated direct voltage, circuit point 226 becomes 1 Vbe negative with respect to ground, and diode 224 becomes conductive. Further increases in the pulse voltage across winding 220b cannot make circuit point 226 more negative, and therefore the cathode of SCR 214 becomes more positive than terminal 210 and the SCR becomes nonconductive.

When SCR 214 becomes nonconductive at time T1, current continues to flow through inductor 216 to circuit point 230 and through capacitor 218 but instead of returning through SCR 214 passes as described from terminal 210 to 212 of the unregulated source and returns to inductor 216 by way of diode 224. A portion of the current flow of inductor 216 also flows by way of circuit point 230 to deflection circuit 222 and returns by way of diode 224. A portion of the energy stored in the magnetic field associated with inductor 216 is thus returned to the unregulated source and a portion is supplied to deflection circuit 222. At time T2, the retrace interval ends and SCR 214 is again forward-biased but remains nonconductive until a later time T3 at which a gating pulse V236 is generated by voltage control circuit 236, as illustrated in FIG. 5a. At time T3, SCR 214 becomes conductive and the voltage at circuit point 226 rises, again rendering diode 224 nonconductive. Inductor 216 is coupled by SCR 214 across capacitor 218 and capacitor 218 begins to discharge, transferring the energy stored as voltage across its plates to inductor 216 by the series path including SCR 214, as described. This results in a progressive increase in the current of SCR 216 as illustrated in FIG. 5d.

The voltage at circuit point 230 of FIG. 2 is regulated by controlling the average current through inductor 216, which is established by the time T3 during the deflection cycle at which SCR 214 is gated into conduction. Thus, if the regulated voltage at terminal 230 relative to ground tends to decrease below the desired value, control circuit 236 produces a gating pulse V236 earlier during the deflection cycle, as illustrated by time T3' of FIG. 5. As shown by the dashed lines in FIGS. 2c-2e, earlier gating results in a net increase in the average of current I216 through inductor 216 which can discharge capacitor 218 to a greater extent to maintain the regulated voltage in the presence of an increased current drain by deflection circuit 222 or compensate for a low regulated voltage. As in the case of FIG. 1, the description of the operation is for the case in which inductor 216 has a relatively large inductance, and with a smaller inductance the current in inductor 216 may decrease to zero before time T3, whereupon diode 224 will become nonconductive and circuit point 226 will assume the regulated voltage.

Figure 3:
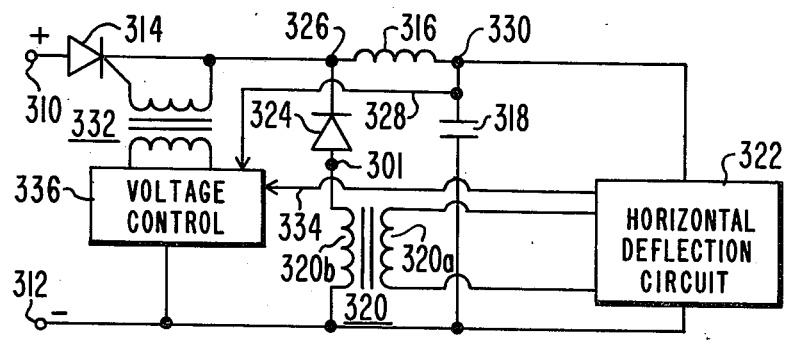

In the embodiments of FIGS. 1 and 2, the turn-off winding is coupled in series with the SCR. It is possible to arrange the turn-off winding in series with the diode, as illustrated in FIG. 3. In FIG. 3, elements corresponding to those of FIG. 1 have the same reference numberal in the 300 series. In FIG. 3, terminals 310 and 312 are adapted to be connected to a source of unregulated direct voltage. An SCR 314 acting as a controllable switch is coupled at a circuit point 326 with a filter inductor 316, which in turn is coupled at a circuit point 330 with a deflection circuit 322, and the series combination is coupled across terminals 310 and 312 to form a first series path for the flow of current in inductor 316. Capacitor 318 is coupled between circuit point 330 and terminal 312 for filtering the current flowing in inductor 316 to form an energizing voltage for deflection circuit 332. A diode 324 has its cathode connected to circuit point 326 and its anode coupled to terminal 312 (ground) by way of a turn-off secondary winding 320b of a transformer 320 to form a closed path for the flow of current through inductor 316, capacitor 318, winding 320b and diode 324 back to inductor 316. The primary winding 320a of transformer 320 is coupled to horizontal deflection circuit 322. A voltage control circuit 336 is coupled by a conductor 328 across capacitor 318 for sensing the voltage to be regulated and is also coupled by a conductor 334 to the horizontal deflection circuit for receiving synchronizing pulses therefrom. Voltage control circuit 336 produces time-modulated SCR gating pulses which are coupled to the gate of SCR 314 by a transformer 332.

Figure 6:
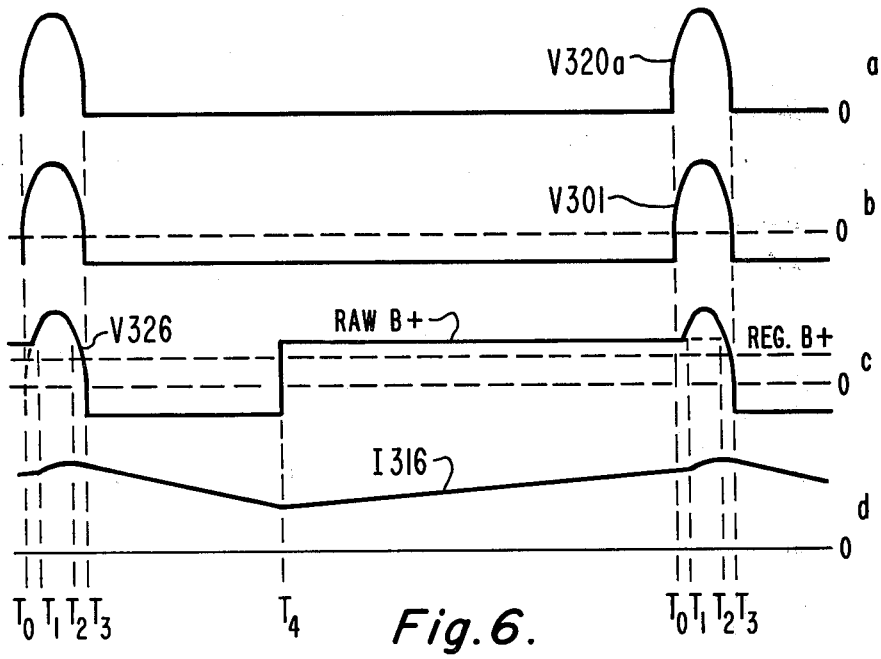

Referring to the waveforms of FIG. 6, immediately prior to the time T0 at which the retrace interval begins, SCR 314 is conductive and circuit point 326 is at essentially the voltage of the unregulated source, as illustrated by FIG. 6c. Diode 324 is nonconductive, and its anode is at a voltage negative with respect to ground by the voltage across winding 320b as illustrated by V301 of FIG. 6b. The current through inductor 316 is increasing in the path extending from terminal 310 of the unregulated source, through SCR 314 and inductor 316, as illustrated by I316 of FIG. 6d under the impetus of the difference between the voltages at circuit points 326 and 330. A portion of this current is supplied to horizontal deflection circuit 322 and the remainder charges capacitor 318.

At time T0, deflection circuit 322 produces a retrace voltage pulse which is coupled to secondary winding 320b of transformer 320. This voltage is poled to make circuit point 301 positive with respect to ground. Diode 324 remains nonconductive until the voltage at point 301 rises at a time T1 to 1 Vbe above the voltage of circuit point 326.

At time T1, diode 324 and winding 320b provide an alternate path for the flow of current through inductor 316. After time T1, the retrace voltage pulse causes a further increase in the voltage at both circuit points 301 and 326, and SCR 314 then becomes nonconductive. At a later time, the retrace pulse voltage at circuit point 301 reaches a peak and begins to decrease. After pulse 301 decreases below the regulated B+, decreasing current continues to flow through inductor 316 in a circular path including capacitor 318, winding 320b and diode 324 as energy associated with the magnetic field of inductor 316 continues to be transferred to capacitor 318. At a time T2, the decreasing voltage at circuit points 301 and 326 causes SCR 314 to again become forward biased. However, SCR 314 does not become conductive until a gating pulse is applied.

The retrace pulse ends at a time T3, and current continues to circulate through inductor 316, capacitor 318 and diode 324, as illustrated by I316 of FIG. 6d. At a time T4, voltage control circuit gates SCR 314 into conduction, raising the voltage at circuit point 326 and rendering diode 324 nonconductive, thereby initiating an interval of increase in the current of inductor 316. As in the case of FIGS. 1 and 2, the regulated voltage between circuit point 330 and ground is maintained by control of the average value of current I316, which in turn is established by relative gating time T4 at which SCR 314 is rendered conductive.

Figure 4:
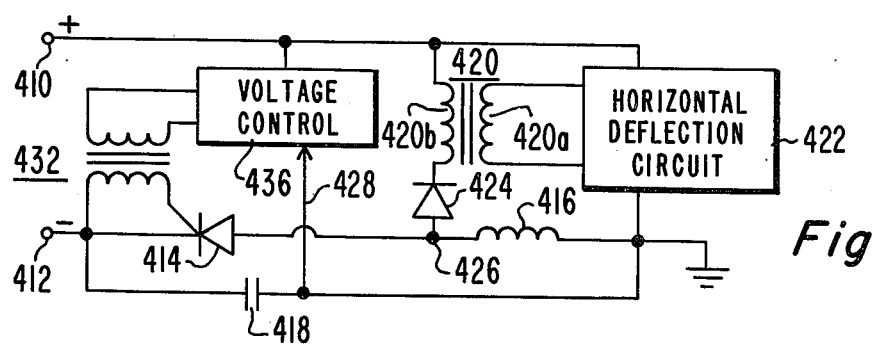

FIG. 4 illustrates an embodiment of the invention similar to FIG. 3 in that the turn-off winding and diode are connected in series. The arrangement of FIG. 4 differs in that the storage capacitor has a different reference point and the SCR is coupled to the negative terminal of the source of unregulated voltage.

In FIG. 4, terminals 410 and 412 are adapted to be coupled to the source of unregulated direct voltage. An SCR 414 has its cathode connected to terminal 412 and its anode coupled by way of circuit point 426, filter inductor 416, ground and horizontal deflection circuit 422 to terminal 410. The ground point corresponds to circuit point 30 of FIG. 1. A storage capacitor 418 is coupled between input terminal 412 and ground for filtering the voltage across deflection circuit 422. A diode 424 has its anode connected to circuit point 426 and its cathode coupled by way of a turn-off secondary winding 420b of a transformer 420 to the positive terminal 410 of the source of unregulated voltage. Horizontal deflection circuit 422 produces retrace pulses which are coupled to winding 420b. A voltage control circuit 436 is coupled by a conductor 428 across the horizontal deflection circuit for sensing the horizontal deflection circuit energizing voltage appearing between terminal 410 and ground and for producing control pulses which are coupled to the gate of SCR 414 by a transformer 432.

The voltage across horizontal deflection circuit 422 equals the difference between the unregulated supply voltage and the voltage across capacitor 418. Current flow in deflection circuit 422 resulting from its operation causes charge to accumulate on capacitor 418 during those intervals in which SCR 414 is nonconductive, thereby increasing the voltage across the capacitor and tending to decrease the voltage available to deflection circuit 422. The regulated voltage is controlled by controllably discharging capacitor 418 through a series path extending from the capacitor through inductor 416 to circuit point 426, to SCR 414 and back to the capacitor, and when the SCR is nonconductive through an alternate path extending from capacitor 418 through inductor 416 to a circuit point 426, through diode 424, winding 420b and through terminal 410 to the source and back to the capacitor by terminal 412.

The waveforms of FIG. 6 are similar in appearance to the waveforms occurring in the arrangement of FIG. 4 during operation, but may differ in polarity and by a fixed offset voltage as a result of the different voltage reference point. Immediately before the time T0 of the beginning of the retrace interval, SCR 414 is conducting and diode 424 is nonconducting. The current through inductor 416 is increasing under the impetus of the voltage across capacitor 418 as energy is transferred from capacitor 418 to inductor 416. During the retrace interval, winding 420b produces a pulse voltage at the cathode of diode 424 which is increasingly negative with respect to terminal 410. When the pulse voltage makes the cathode of diode 424 approximately 1 Vbe negative with respect to circuit point 426, SCR 414 becomes nonconductive and diode 424 becomes conductive to provide decreasing current flow through the alternate series path including diode 424, winding 420b, the unregulated source, capacitor 418 and inductor 416. At the end of the retrace interval, the voltage across winding 420b is small, and current continues to flow through diode 424 and the alternate series path. As a result, circuit point 426 is at a voltage near that of terminal 410, and SCR 414 is forward biased. During the interval extending from the end of the retrace interval to the time when SCR 414 is rendered conductive, inductor 416 is essentially coupled across the unregulated source and the current in inductor 416 decreases as it gives up energy to the source. The decrease in current in inductor 416 ends at a time corresponding to T4 of FIG. 6, at which time SCR 414 is gated into conduction, the voltage of circuit point 426 becomes negative and renders diode 424 nonconductive and the voltage of capacitor 418 is once again impressed across inductor 416 to begin to increase the current and energy stored in inductor 416.

Regulation of the voltage across horizontal deflection circuit 422 in the arrangement of FIG. 4 is as in the other illustrated embodiments by control of the average of the periodically increasing and decreasing current through inductor 416, which in turn is controlled by variable gating time T4.

Synchronization of the gating of the control SCR with the horizontal deflection may be desirable but is not absolutely essential in order to accomplish regulation. While in the illustrated embodiments the voltage control circuit senses the voltage across the load represented by the horizontal deflection circuit in order to regulate the voltage in a feedback manner, other voltages associated with the horizontal deflection circuit may be sensed and regulated instead. For example, the ultor voltage commonly generated by rectifying and filtering the retrace pulses produced by the deflection circuit may be sensed by the voltage control circuit, in which case the ultor voltage is regulated by controlled variation of the energizing voltage applied to the horizontal deflection circuit. Any of a number of circuit points may be taken as reference ground, any by proper choice thereof negative regulated voltages can be produced. The voltage controlled pulses may be coupled to the gate of the control SCR by a capacitor rather than by a transformer, and the retrace pulses may be capacitively coupled across the turn-off winding from the horizontal deflection circuit.

What is claimed is:

1. A switching regulator for a television apparatus, comprising:
    a controllable switch, an inductor and a horizontal deflection generator forming a first series circuit coupled across a source of unregulated direct voltage for providing a path for an increasing current flow in said inductor during those intervals in which said switch is closed, said switch including a gate and a main current conduction path which when forward biased remains open until a signal is applied to said gate and which thereafter remains closed so long as said forward bias is maintained;
    coupling means coupling horizontal rate signals from said deflection generator to said main conduction path of said switch for controlling the opening thereof;
    a diode coupled with said inductor to form a path for a decreasing current flow in said inductor during at least a portion of those intervals in which said switch is opened;
    a capacitor coupled to said deflection generator for filtering said current flow in said inductor to form an operating voltage for said deflection generator; and
    control means coupled to said deflection generator and to said gate for controlling the closing of said switch for controlling the average of said increasing and decreasing currents in said inductor and thereby controlling said operating voltage in a feedback manner.

2. A regulator according to claim 1 wherein said coupling means comprises a winding serially coupled with said main current conduction path.

3. A regulator according to claim 1 wherein said coupling means comprises a winding serially coupled with said diode.

4. A regulator according to claim 2 or 3 wherein said winding is magnetically coupled with said deflection generator.

5. A regulator according to claim 1 wherein said capacitor is coupled to a terminal of said source.

6. A regulator according to claim 1 wherein:
    said coupling means comprises a winding serially coupled with said main current conducting path to form a third series circuit, said third series circuit being coupled at one terminal to a first terminal of said source;
    said winding is magnetically coupled to said deflection generator; and
    said diode and said capacitor are coupled to a second terminal of said source for charging said capacitor at an increasing rate during at least a portion of said intervals in which said switch is closed and for continuing to charge said capacitor at a decreasing rate during at least portions of said intervals when said switch is open.

7. A regulator according to claim 1 wherein:
    said coupling means comprises a winding serially coupled with said main current conduction path to form a third series circuit, said third series circuit being coupled to a first terminal of said source;
    said winding is magnetically coupled with said deflection generator;
    said capacitor is coupled to said first terminal of said source for charging through said deflection generator and for being discharged at an increasing rate during said intervals in which said switch is closed; and
    said diode is coupled to a second terminal of said source for continuing to discharge said capacitor at a decreasing rate during at least portions of said intervals in which said switch is open.

8. A television deflection apparatus adapted to be energized from a source of unregulated direct voltage, comprising:
    storage capacitance means;
    a first winding including a first terminal coupled with a first terminal of said capacitance means to form a series combination;
    controllable switch means having a control electrode and a main current conduction path which when forward biased remains nonconductive until a signal is applied to said control electrode and which thereafter remains conductive for so long as said forward bias is maintained;
    first coupling means for coupling said main conduction path to a first terminal of the source of unregulated voltage and to a second terminal of said first winding for providing a forward bias to said main conduction path and for providing a first path for the flow of current between said source and said series combination thereby generating a second voltage at said first terminal of said capacitance means;
    control means coupled to said control electrode and to said capacitance means for generating a switch control signal for periodically gating said switch into conduction at times which are modulated in a manner to control the flow of current in said first series combination and thereby stabilize said second voltage;

second coupling means coupling a second terminal of said capacitance means to one of said first and second terminals of said source for filtering said second voltage;

a deflection circuit coupled to said first terminal of said capacitance means and to said second terminal of said source for being energized by said stabilized second voltage, said deflection circuit producing voltage pulses during recurrent retrace intervals;

rectifier means;

third coupling means for coupling said rectifier means to said second terminal of said source and to said second terminal of said first winding for providing a second path for the flow of current between said source and said first series combination; and a second winding serially coupled with one of said first and third coupling means and also coupled to said deflection circuit for reducing said forward bias during said retrace intervals and thereby promoting turn-off of said switch means.

* * * * *